United States Patent
Perner et al.

(10) Patent No.: US 6,754,123 B2
(45) Date of Patent: Jun. 22, 2004

(54) ADJUSTABLE CURRENT MODE DIFFERENTIAL AMPLIFIER FOR MULTIPLE BIAS POINT SENSING OF MRAM HAVING DIODE ISOLATION

(75) Inventors: Frederick A. Perner, Palo Alto, CA (US); Anthony P. Holden, Boise, ID (US)

(73) Assignee: Hewlett-Packard Development Company, L.P., Houston, TX (US)

(*) Notice: Subject to any disclaimer, the term of this patent is extended or adjusted under 35 U.S.C. 154(b) by 10 days.

(21) Appl. No.: 10/261,532

(22) Filed: Oct. 1, 2002

(65) Prior Publication Data

US 2004/0062117 A1 Apr. 1, 2004

(51) Int. Cl.[7] .................................................. G11C 7/02
(52) U.S. Cl. ......................................... 365/209; 210/158
(58) Field of Search ................................ 365/209, 210, 365/158, 175, 243, 213

(56) References Cited

U.S. PATENT DOCUMENTS 6,169,686 B1    1/2001  Brug et al.
6,262,625 B1    7/2001  Perner et al.
6,501,697 B1  * 12/2002  Perner et al. ................ 365/209

* cited by examiner

Primary Examiner—David Lam

(57) ABSTRACT

A sensing circuit for determining the logic state of each memory cell in a resistive memory array, wherein each memory cell in the resistive memory array has current control isolation and the logic state of each memory cell can be determined relative to a reference cell having a preselected logic state. The sensing circuit comprises a memory cell sensing circuit to determine a bias voltage of a memory cell, a reference cell sensing circuit to determine a bias voltage of a reference cell, an isolation circuit to apply an isolation voltage to turn off a current control element associated with each unselected memory cell, an adjusting circuit to make the bias voltage on the memory cell approximately equal to the bias voltage on the reference cell, and a state determining circuit for determining the logic state of the memory cell.

23 Claims, 7 Drawing Sheets

ADJUSTABLE CURRENT MODE DIFFERENTIAL AMPLIFIER FOR MULTIPLE BIAS POINT SENSING OF MRAM HAVING DIODE ISOLATION

BACKGROUND OF THE INVENTION

1. Field of Invention

The present invention pertains to the field of memory sense amplifiers. More particularly, this invention relates to memory differential sense amplifiers having adjustable sense and reference circuitry for sensing magnetic random access memory with diode isolation.

2. Background

In a random access memory (RAM) array, an amplifier is used to sense the state of an addressed memory cell and provide a signal representing the sensed state to the output of the array. This sense amplifier takes different forms, depending on the type of RAM array. In a static random access memory (SRAM) array or dynamic random access memory (DRAM) array, the memory is often volatile, that is, not retaining the data when the array is powered off. Such memories are often complex and require complex sensing circuitry such as steering (decoder) circuits and clocked, current mode amplifiers.

In contrast, a non-volatile memory array, such as a cross-point array, utilizes very simple compact memory cells, such as the cross-point type, concerned with long-term retention, high density and fast access. A non-volatile array may be a write-once type having a fuse or anti-fuse at each cross-point cell, or a multiple read-write variety, such as a magnetic random access memory (MRAM) array having cross-point magnetic cells each capable of changing between two or more states.

One problem with resistive memory arrays, such as arrays using MRAM cells, is the difficulty in accurately determining the logic state of a memory cell. This problem arises because the cell states are not measured by conductance or non-conductance, as in an anti-fuse memory. Rather the MRAM cell states are determined by minute differences in the conductivity of a thin insulating junction embedded within the MRAM memory cell caused by the relative direction of the magnetization of ferromagnetic layers adjacent to the thin insulating junction. Typically, the states of an MRAM cell are determined by a data magnetic layer having a magnetic moment either "parallel" or "anti-parallel" relative to a fixed magnetic layer. The states are measured by a difference in the resistance caused by the magnetism of the data layer being "parallel" or "anti-parallel" to the fixed layer. This resistance is sensed by the current flow through the insulation layer and the magnitude of the sense current is typically on the order of 500 nA, and the difference in the current between the "parallel" and the "anti-parallel" states is typically about 50 nA.

Accordingly, it is crucial to carefully sense small variations in the sensed current through a selected memory cell, in order to accurately determine the logic state of the cell. One common sense amplifier is a current mode sense amplifier where the memory cell current must be sensed by a circuit that depends on a precision current mirror as part of the sense amplifier. Thus, for current mode sense amplifiers, it is also important to provide an accurate "mirror" of the sensed current from the cell to the sense amplifier, as well as to provide a means of measuring the sensed current against a reliable standard to determine the state of the cell.

In addition, there is a greater need for higher density memory devices to meet the memory requirements of increasingly complex devices. This demand has lead to increased miniaturization and more compact data storage than ever before. Efforts are now underway to adapt technology to enable the storage of data on scale of nanometers to tens of nanometers, sometimes referred to as atomic resolution storage. This size reduction and compactness of memory devices requires smaller voltages and currents, resulting in the need for greater preciseness in measuring the currents and voltages to accurately determine the data in the cell.

In dealing with miniaturized circuits and extremely small currents and voltages, it is important to minimize the intrusive nature of the sensing function. Each element that is used in a sensing circuit may contribute to voltage and current distortions or leakages that will have an impact on the measurement accuracy of the sensor. Accordingly, it is imperative that a sense amplifier for high-density memory cells must minimize any intrusions into the memory matrix that could result in adverse affects on the parameters being sensed.

Voltage mode sense amplifiers sometimes require complex circuitry to achieve accuracy. For example, one voltage mode differential amplifier requires five transistors in a complex circuit to carry out the necessary sensing, as seen in U.S. Pat. No. 6,262,625, granted to Perner et al. on Jul. 17, 2001. In that circuit, back gate digital controlled voltages are applied to a pair of transistors so that the sense amplifier offset parameters may be incrementally adjusted. Back gate digital control values are stored in a register memory to control the precision of the sense amplifier, further increasing the complexity of the sensing circuit.

Current mode sense amplifiers are sometimes used for high density, sensitive memory matrix sensing. However, current mode sense amplifiers tend to require a high level of component matching because of the limited dynamic range of such a circuit. If the current of the reference cell is substantially different than the current of the memory cell being sensed, the current mode sense amplifier may not be able to accurately determine the logic state of the memory cell. Adding components, such as additional sense resistors, may compensate for this limited range problem. However, the addition of components to a current sense circuit tends to adversely affect the circuits being sensed.

Other sense amplifiers use analog to digital conversion (ADC) to measure the sense and reference currents and compare them digitally. This approach is useful in extending the dynamic range of the components. However, the increased complexity of the sensing circuit is an important disadvantage.

In addition, in sensing the state of a memory cell in a memory cell array, secondary undesirable currents may be generated through unselected memory cells. All memory cells are coupled together through many parallel paths between the operating potential and ground. Consequently, in addition to the sense current flowing though the selected cell, secondary or sneak path currents can flow through a number of unselected cells. These combined sneak path currents can detract and even obscure the desired sense current through the selected memory cell.

Accordingly, a simple sensing amplifier is needed for measuring memory cell matrices at very low levels of sense currents and voltages. Sensing components are needed that will accurately mirror the sense parameters and reflect them to sensing circuit. In addition, a sense amplifier is needed that uses a small number of components so that the intrusion into a memory matrix is minimized. It is important that a sensing amplifier have a relatively wide dynamic range for accommodating different levels of currents and voltages. Finally, it is important for the sense amplifier to be able to sense parameters in an MRAM array having circuitry to minimize undesirable sneak path currents during the sensing process.

SUMMARY OF THE INVENTION

The present invention provides a useful and unique sensing circuit in the nature of an adjustable current mode differential sense amplifier. The amplifier is in communication with a selected memory cell and a reference cell having a predetermined value. The amplifier is able to sense current and voltage changes associated with the selected memory cell and compare them to current and voltage changes associated with the reference cell. The sense amp of the present invention further is able to sense memory cells having current control isolation to minimize secondary and sneak path currents in unselected memory cells.

The operating point of the sensing amplifier may be changed by modifying the threshold voltage of isolated transistors in the sense amplifier. This is accomplished in a non-invasive manner by applying a control voltage on back gate electrodes of the isolated transistors. This adjusting capability enables currents or voltages of the sense amplifier to be set when a first bias voltage is applied to a selected memory cell in order to maximize the sensitivity of the amplifier. When a second bias voltage is applied to the memory and reference cells in order to determine the memory cell value, the amplifier is able to sense slight changes in the currents or voltages associated with the selected memory cell and the reference cell and compare them to determine the state of the memory cell. This increased sensitivity enables the amplifier to have a substantially increased dynamic range without introducing components that might adversely affect the memory circuitry parameters.

An apparatus embodiment of the present invention comprises a sensing circuit for determining the logic state of a memory cell in a resistive memory device. The circuit includes a reference cell having a pre-selected logic state. A memory cell sensing circuit is adapted to determine a first memory cell voltage associated with the memory cell when a first bias voltage is impressed on the memory cell and to determine a second memory cell voltage associated with the memory cell when a second bias voltage is impressed on the memory cell. A reference cell sensing circuit is adapted to determine a first reference cell voltage associated with the reference cell when the first bias voltage is impressed on the reference cell and to determine a second reference voltage associated with the reference cell when the second biasing voltage is impressed on the reference cell. An isolation circuit applies an isolation voltage to turn off a current control element, such as a diode in series with each unselected memory cell, the isolation voltage being applied such as to reverse bias the current control element when the first bias voltage and the second bias voltage are applied to the memory cell and the reference cell. An adjusting circuit is used to modify either the first reference cell voltage or the first memory cell voltage so that the first reference cell voltage is equal to the first memory cell voltage at the first bias voltage. A state determining circuit is disposed to sense the difference between the second memory cell voltage and the second reference cell voltage at the second bias voltage in order to determine the logic state of the memory cell.

Similar to the above apparatus embodiment, a method embodiment of the present invention is a method for determining the logic state of a memory cell in a resistive memory device, using a reference cell previously set to a known logic state. The method comprises determining the logic state of a memory cell in a resistive memory device relative to a reference cell having a pre-selected logic state. A first memory cell voltage associated with the memory cell and a first reference cell voltage associated with the reference cell are sensed when a first bias voltage is impressed on the memory cell and the reference cell. An isolation voltage is applied to each unselected memory cell to turn off a current control element, such as a diode in series with each unselected memory cell, the isolation voltage being applied so as to reverse bias the current control element when the first bias voltage and the second bias voltage are applied to the memory cell and the reference cell. The first memory cell voltage or the first reference cell voltage is then adjusted using a non-invasive back gate control voltage so that the first reference cell voltage and the first memory cell voltage are approximately equal to each other. Next, a second memory cell voltage associated with the memory cell and a second reference cell voltage associated with the reference cell are sensed when a second bias voltage is applied to the memory cell and to the reference cell. Then the difference between the second memory cell voltage and the second reference cell voltage is measured to determine the logic state of the memory cell.

It should be understood that, for both the apparatus and method embodiments described above, rather than sensing and adjusting the first and second memory cell voltages and the first and second reference cell voltages, other parameters associated with the memory cell and reference cell, such as current or resistance, may be sensed and adjusted in order to determine the state of a selected memory cell. The scope of the present invention is meant to include selecting any parameter associated with the selected memory cell and the reference cell to be sensed and adjusted according to the principles of the present invention.

Other aspects and advantages of the present invention will become apparent from the following detailed description, which in conjunction with the accompanying drawings illustrates by way of example the principles of the present invention.

DETAILED DESCRIPTION OF EMBODIMENTS OF THE INVENTION

Figure 1:
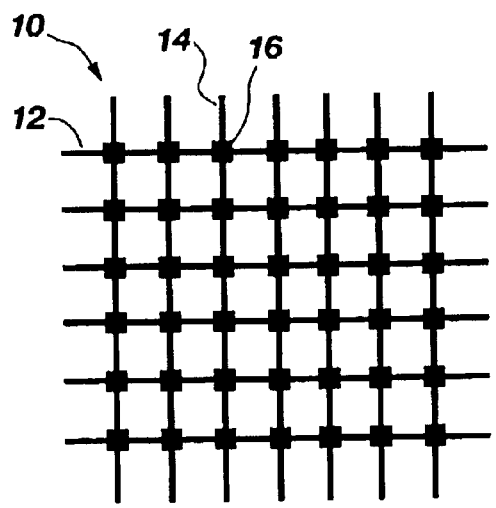
FIG. 1 is a schematic view showing a prior art resistive cross point memory device according to the present invention.

FIG. 1 shows a typical prior art cross-point memory array 10. The row conductors 12 running in one direction are referred to as the word lines, and the column conductors 14 extending in a second direction usually perpendicular to the first direction are referred to as the bit lines. The memory cells 16 are usually arranged in a square or rectangular array so that each memory cell unit 16 is connected with one word line 12 and an intersecting bit line 14.

In a resistive RAM array, the resistance of each memory cell has more than one state, and the data in the memory cell may be determined by measuring the resistive state of the cell. The resistive memory cells may include one or more magnetic layers, a fuse or anti-fuse, or any element that stores or generates information by affecting the magnitude of the nominal resistance of the element. Other types of resistive elements used in a resistive RAM array include poly-silicon resistors as part of a read-only memory, and floating gate transistors as part of optical memory, imaging devices or floating gate memory devices.

One type of resistive random access memory is a magnetic random access memory (MRAM), in which each memory cell is formed of a plurality of magnetic layers separated by insulating layers. One magnetic layer is called a pinned layer or reference layer, in which the magnetic orientation is fixed so as not to rotate in the presence of an applied magnetic field in the range of interest. Another magnetic layer is referred to as a sense layer or data layer, in which the magnetic orientation is variable between a state aligned with the state of the pinned layer and a state in misalignment with the state of the pinned layer. An insulating tunnel barrier layer sandwiches between the magnetic pinned layer and the magnetic sense layer. This insulating tunnel barrier layer allows quantum mechanical tunneling current to flow between the sense layer and the pinned layer when an external sense voltage is applied. The tunneling is electron spin dependent, causing the resistance of the memory cell to be a function of the relative orientations of the magnetizations of the sense layer and the pinned layer. The variations in the junction resistance for the two states of the sense layer determine the data stored in the memory cell. U.S. Pat. No. 6,169,686, granted to Brug et al. on Jan. 2, 2001 discloses such a magnetic memory cell memory.

Figure 2:
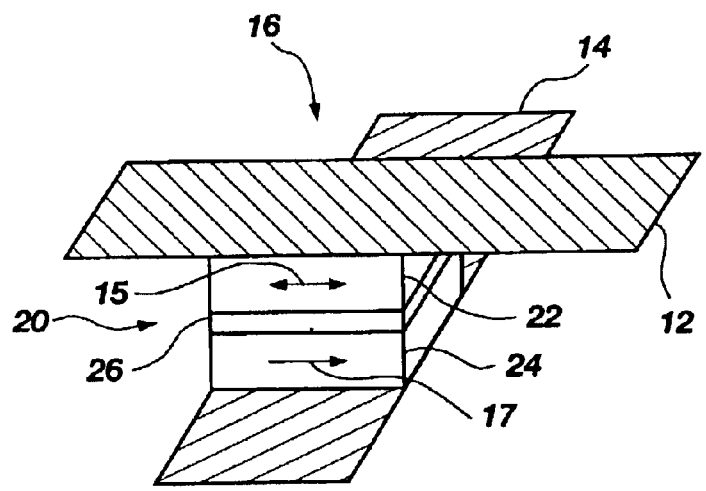
FIG. 2 is a schematic view showing the prior art structure of a MRAM memory cell and the conductors connected thereto.

Referring to FIG. 2, a MRAM memory cell is shown. Memory unit 16 is shown as a three-layer magnetic tunnel junction (MTJ) memory cell 20. In each MTJ cell 20 a bit of information is stored according to the orientation of a changeable magnetic sense layer 22 of the cell 20. Usually, the cell 20 has two stable magnetic states corresponding to the logic states "1" and "0." The two-way arrow 15 on the sense layer 22 shows this binary-state capability. A pinned layer 24 in the cell 20 is separated from the sense layer by a thin insulator 26. The resistance across the MTJ memory cell 20 is determined by the characteristics of thin insulator 26 and the orientation of the changeable magnetic sense layer 22.

Pinned layer 24 has a fixed magnetic orientation, such as shown by the one-way arrow 17 on layer 24. When the magnetic state of the sense layer 22 is oriented in the same direction as the direction of the magnetization of the pinned layer 24, the cell magnetization is referred to as "parallel." Similarly, when the magnetic state of the sense layer 22 is oriented in the direction opposite to the direction of the magnetization of the pinned layer 24, the cell magnetization is referred to as "anti-parallel." These orientations correspond to a low resistance state and a high resistance state, respectively. Arbitrarily, the parallel state might be considered to correspond to a "0" state or logic value of the memory cell and the anti-parallel state might be considered to correspond to a "1" state, although the assignment of "0" and "1" states might be reversed, if desired.

The magnetic state of a selected memory cell 20 may be changed by applying currents to a word line 12 and a bit line 14 crossing the selected memory cell. The currents produce two orthogonal magnetic fields that, when combined, will switch the magnetic orientation of the sense layer of the selected memory cell 20 between the parallel and anti-parallel states. Other unselected memory cells receive only a magnetic field from either the word line or the bit line crossing the unselected memory cells. The single field is not strong enough to change the magnetic orientation of the sense layer of the unselected cells, so they retain their magnetic orientation.

Figure 3:
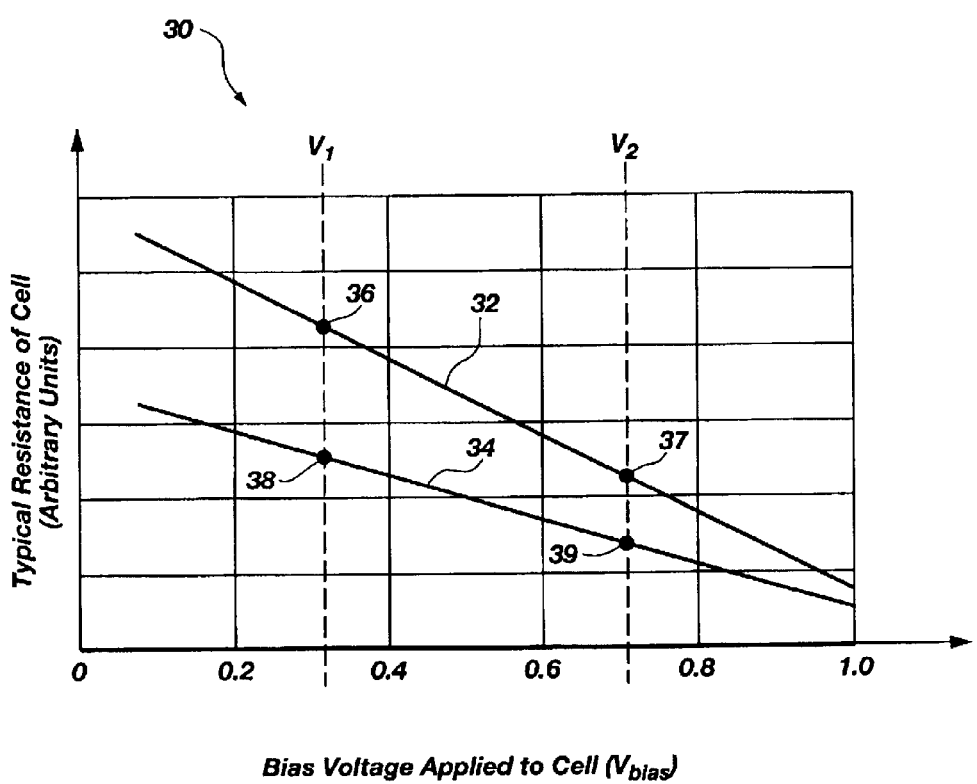
FIG. 3 is a graphical illustration of the resistance values of a MRAM memory cell measured as a function of applied bias voltage for two different logic states of the cell.

As explained above, in resistive memory cell devices, the difference in memory cell logic states is determined by the difference in resistance of a memory cell in a parallel state and in an anti-parallel state. As seen in graph 30 of FIG. 3, the resistance level of resistive cells, particularly MRAM cells, has been found to vary with the application of different levels of bias voltages to the cells. Generally, the resistance of resistive cells has been found to decrease with an increase in bias voltage. Cells in the anti-parallel state, shown by line 32, have a higher resistance value than cells in the parallel state, shown by line 34.

It has been found that the resistance of cells in the anti-parallel state normally decrease at a much more rapid rate than the resistance of cells in the parallel state with an increase in bias voltage, as can be seen by comparing the slope of line 32 to that of line 34. As is well known in the art, this dynamic difference in resistance at different bias voltages is a consistent trait of magnetic tunnel junction (MTJ) memory devices that is typically quantified by determining the tunneling magneto-resistance ratio (TMR) of a MTJ device.

This dynamic difference in the resistances of cells in the anti-parallel and parallel states has been exploited in a two-sample method described in co-pending patent application entitled "System and Method For Determining the Logic State of a Memory Cell in a Magnetic Tunnel Junction Memory Device" (HP docket number 10014201-1). In this method the memory cell current is sampled at two different bias voltages, $V_1$ and $V_2$, and the ratio of the first and second current values 36 and 37 (anti-parallel state) or 38 and 39 (parallel state) is compared to a predetermined value to determine the logic state of a memory cell. The predetermined value can be stored in a table or determined from a reference cell having a known logic state.

Since the slope or gradient of the curve 32 for the anti-parallel state is considerably greater than the slope of the curve 34 for the parallel state, the corresponding ratios of the two measurements at different bias voltages will easily determine the logic state of the memory cell.

In the present invention, the reference values are provided by a reference cell that is subjected to the same bias voltages as the memory cell. A sense circuit compares the currents in both the reference cell and the memory cell at selected bias voltages by comparing both the sense and reference currents in the sense circuit. The reference and sense currents result in reference and sense voltages at the input nodes of the sense circuit that vary depending on the bias voltages applied to the reference and memory cells. At a first bias voltage, the sense circuit is adjusted so that the first reference voltage is approximately the same value as the first sense voltage. This adjustment proportionately reduces the difference between the first reference voltage and the first sense voltage at the first bias voltage measurement point, thus enabling a close tuning of the circuit. Accordingly, the dynamic range of the current sampling is improved by eliminating common mode differences between the reference memory element and the sensed memory element.

Figure 4A:
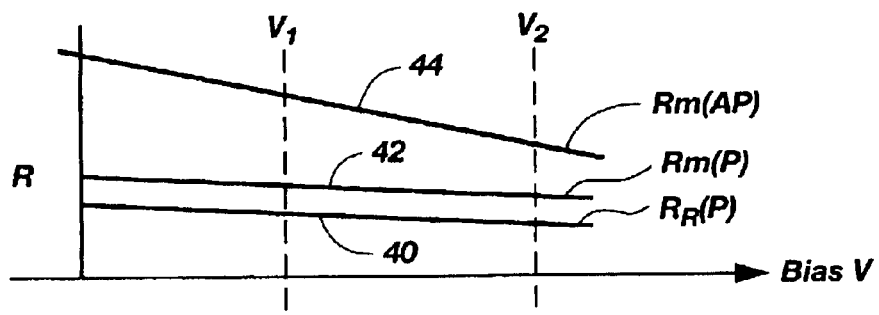
FIGS. 4A, 4B and 4C are graphical illustrations showing the relationship between memory cell resistance to the reference cell resistance at various bias voltages, according to the present invention.
Figure 4B:
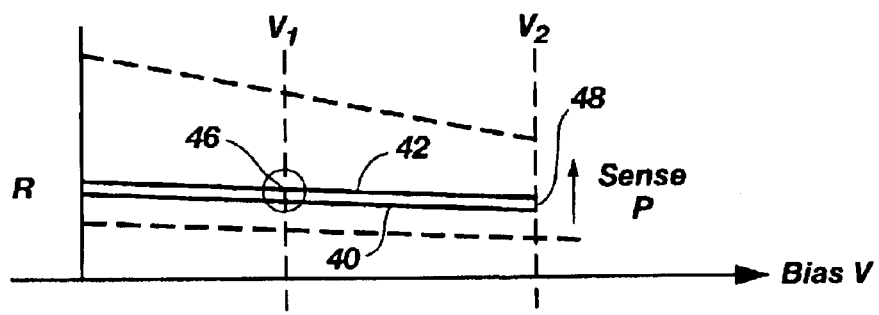
Figure 4C:
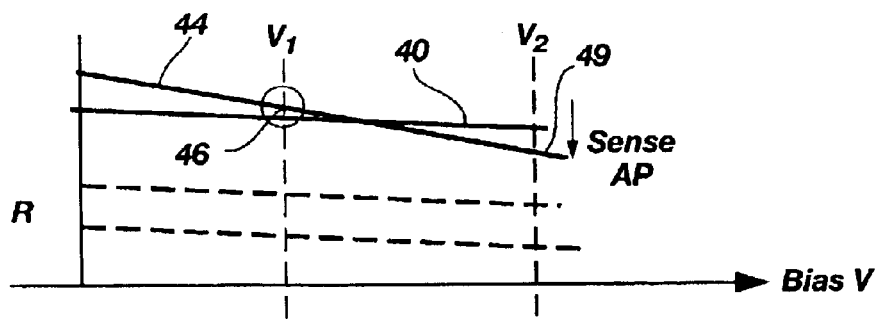

The above arrangement is illustrated in FIGS. 4A, 4B and 4C showing the relationship of an inferred, relative resistance of a memory cell to an inferred relative resistance of a reference cell for different bias voltages and at different memory cell logic states. This resistance relationship is also indicative of the differences in currents and voltages associated with a selected memory cell and the reference cell. The linear relationship of resistances is used here for purposes of simplicity of illustration of the principles applied in the present invention. As will be seen later, it is preferable to sense and adjust the currents indirectly by sensing and adjusting voltages associated with the selected memory cell and the reference cell.

By way of further explanation, FIGS. 4A–C are used to illustrate the concept of sensing a reference element in a known state and comparing it to the selected element. The basic parameter being determined is resistance. However, in this embodiment, the parameters that are actually being sensed by the sense amplifier are voltage and current. In the described sensing arrangement, the sense currents are modified by sneak paths, so it is impossible to make an absolute resistance measurement. Instead relative values of other parameters are sensed, from which resistance values are inferred. In FIG. 4A–C, the y-axis is the inferred resistance which is a complex function of the applied voltage, amplifier offsets, and sneak path resistances.

As shown by line 40 in FIG. 4A, the reference cell resistance $R_R$ is set to the parallel state $R_R(P)$. In this parallel state, a characteristic of the MRAM cell is a weak dependence on the bias voltage. Thus, there is little change in resistance as the bias voltage changes, so that line 40 has only a slight slope.

The selected memory cell resistance $R_M$ is either in a parallel state $R_M(P)$, as shown by line 42, or an anti-parallel state $R_M(AP)$, as shown by line 44. The voltage dependence of the resistance $R_M$ of the selected cell will be similar to that of the resistance $R_R$ of the reference cell. Thus, line 42 indicates that, if the selected cell is in the parallel state, there will be relatively little change in resistance $R_M(P)$ with a change of bias voltage, compared to line 44 showing the greater slope or change of resistance $R_M(AP)$ of the memory cell in the anti-parallel state with changes in bias voltage. Preferably, the reference cell is located physically near the selected memory cell so that the reference and memory cells share the same or very similar processing and environmental conditions.

It should be noted that the absolute resistance values of the resistances indicated in FIGS. 4A–4C of the selected memory cell and the reference cell do not have to be the same and, in fact, are assumed to be different. These differences in absolute values will not affect the above ratios, as will be explained in more detail below.

FIGS. 4B and 4C show the differences between the relative resistances $R_M$ and $R_R$, depending on whether the selected memory cell is in the parallel state (line 42) or the anti-parallel state (line 44), respectively. As shown in FIGS. 4B and 4C, regardless of the state of the memory cell at the point that the first voltage $V_1$ is applied, the current through $R_R$ of the reference cell is adjusted so that it is nearly the same as the current through $R_M$ of the memory cell. The process of adjusting the current through $R_R$ adjusts the amplifier offset parameters so that the inferred, relative resistance representing the reference element is approximately equal to the inferred, relative resistance representing $R_M$. Preferably, the current through $R_R$ is slightly less than the current through $R_M$, providing a small difference between the current values and a small difference between the inferred relative resistance values, shown as a delta difference 46 in both FIGS. 4B and 4C.

This adjustment in the current through $R_R$ of the reference cell at the time that $V_1$ is applied results in a dramatic difference between currents at $V_2$, depending on the state of the memory cell. As shown in FIG. 4B, if the selected memory cell is in the parallel state, the inferred resistance $R_M$ has little change between $V_1$ and $V_2$, so a delta difference 48 between the inferred resistances $R_M$ and $R_R$ at bias voltage $V_2$ is about the same as the delta difference 46 at bias voltage $V_1$. Accordingly the sensing circuit used to measure this difference will not change substantially in its output value.

In contrast, as shown in FIG. 4C, at the point where the bias voltage $V_2$ is applied, the inferred relative resistance $R_M$ of the selected memory cell in the anti-parallel state shown by line 44 has dropped substantially below the inferred resistance $R_R$ of the reference cell, shown by line 40, resulting in a greater delta difference 49. Moreover, the lines 40 and 44 have crossed, which changes the sign of the delta difference 49.

Since current changes in the sense circuit correspond to inferred, relative resistance changes, the foregoing analysis is indicative of the resistances of the reference and memory cells. Thus, the logic state of the memory cell can be determined by comparing the values of the reference and memory cell currents at the second bias voltage point. If the difference 48 between the values of the memory cell and reference cell currents at the second bias voltage $V_2$ is about the same as the difference 46 between the values of the memory cell and reference cell currents at the first bias voltage $V_1$, then the memory cell resistance is understood to be parallel, (which might be the logic value 0) as shown in FIG. 4B. If the values of the memory cell and reference cell currents have changed and there has been a cross-over of values, and the memory cell is anti-parallel. If the memory cell current is still higher than the reference current, the memory cell is parallel.

Figure 7:
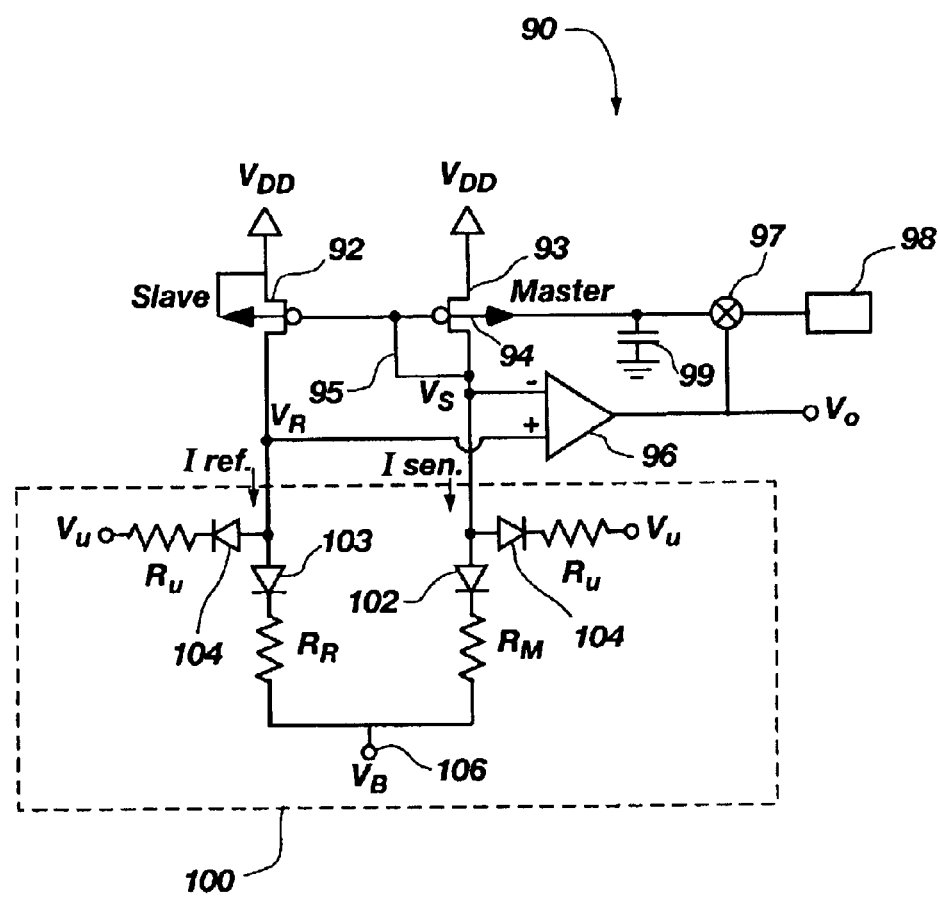
FIG. 7 is a schematic circuit diagram showing one embodiment of the sense amplifier according to the present invention.

A similar analysis may be made for voltages at nodes associated with the memory cell and the reference cell, as will be seen in the discussion regarding the circuitry in FIG. 7.

Figure 5:
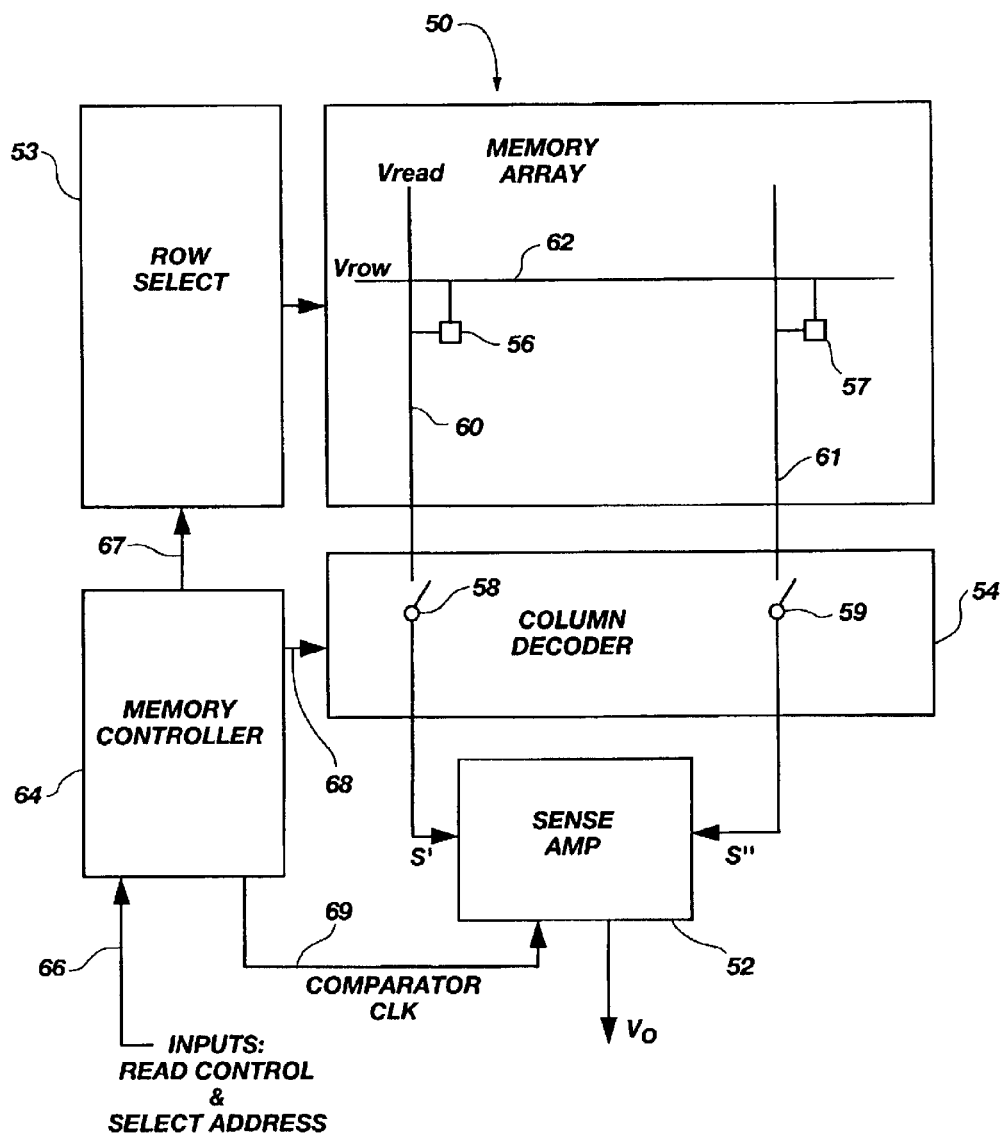
FIG. 5 is a schematic block diagram showing the structure of a MRAM memory cell array and sensing elements, according to the present invention.

Referring now to FIG. 5, a resistive memory array 50 shows one context for the sensing circuit of the present invention. A row selector circuit 53 and a column decoder circuit 54 are connected to the memory array 50 to select a memory cell 56 by providing voltages on the appropriate row and column of cell 56. A sense amplifier 52 is connected through switch 58 in the column decoder circuit 54 to the bit line 60 of the selected memory cell 56. The row selector circuit 53 applies a voltage $V_{row}$ to the word line 62 of the selected memory cell 56, and a voltage Vs' is applied to the bit line 60.

A memory controller 64 receives read control and select address signals 66 and provides the appropriate row and column select signals to the row select circuit 53 and the column decoder circuit 54 on lines 67 and 68, respectively. A comparator clock signal 69 is applied to sense amplifier 52, for purposes of clocking an op amp 96, shown in FIG. 7, if a timing pulse is desired. The op amp 96 controls a transmission gate to supply a variable voltage to the back gate of transistor 93, as discussed with respect to the circuitry in FIG. 7.

As shown in FIG. 5, a reference element 57 is connected to word line 62 and reference column line 61. When the voltage $V_{row}$ selects memory cell 56 it also selects reference element 57. After selection, an operational amplifier (not shown) in the sense amplifier 52 acts to hold reference column 61 at read voltage Vs". Accordingly, reference element 57 is subject to the same voltages applied to the selected memory cell 56.

The sense amplifier 52 receives a signal current at S' from cell 56 indicative of the data stored therein. Likewise, an output signal current at S" from reference element 57 is applied through switch 59 to sense amplifier 52. In turn, sense amplifier 52 compares the sense current at S' from the memory cell to the reference current at S" and provides an output signal $V_O$ indicative of the data stored in memory cell 56.

As previously mentioned one of the problems with MRAM arrays is the presence of secondary or "sneak" currents that take alternate paths through unselected memory cells between the selected row and column lines. It is desirable to minimize these sneak currents in order to minimize power loss and to enhance accuracy in the memory array.

Figure 6A:
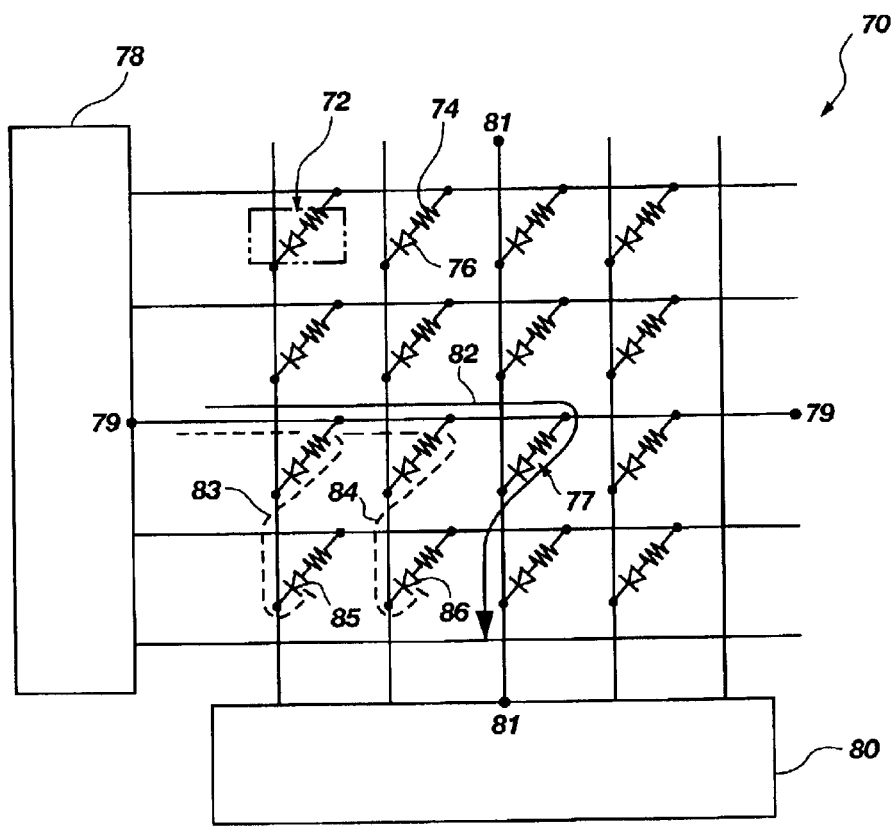
FIG. 6A is a memory matrix diagram showing a MRAM array with diode isolation.

FIG. 6A shows a partial resistive memory array 70 having memory cells 72, each consisting of a magnetic tunnel junction (MTJ) cell 74, similar to MTJ cell 20 in FIG. 2. To minimize sneak currents, each memory cell 72 includes a diode 76 connected in series with the MTJ cell 74. Thus, currents that would otherwise flow through unselected memory cells between selected row and column lines will be blocked by diode 76. The use of a current control device, such as a simple PN junction diode, associated with each memory cell to isolate the unselected cells is referred to herein as "current control isolation" and includes a circuit that can shut off sneak currents and secondary currents in unselected memory cells, such as a diode in series with the memory cell that is reversed biased when not being sensed. A device for controlling the flow of current, such as a diode, is referred to herein as a "current control device." Other types of current control devices that could be used in place of the simple PN junction diode shown here include transistors and complex diodes such as silicon-controlled rectifiers and four layer diodes.

For example, if memory cell 77 is selected, the bias voltage from row decoder 78 on row line 79 and the bias voltage from column decoder 80 on column line 81 are selected so that current flow 82 would run along row line 79, through the selected memory cell 77 and down column line 81 to a sense amplifier in column decoder 80. Sneak path currents, such as current flows 83 and 84 would be blocked by diodes 85 and 86, respectively, as shown. Typically, a selected line voltage, such as the voltage on column 81 is dropped to ground, and the voltage on the row line 79 is raised above its normal voltage to promote the current flow. The bias voltage on unselected memory cells is set so that all diodes in unselected memory cells are reversed biased to eliminate current flow through the unselected memory cells.

Figure 6B:
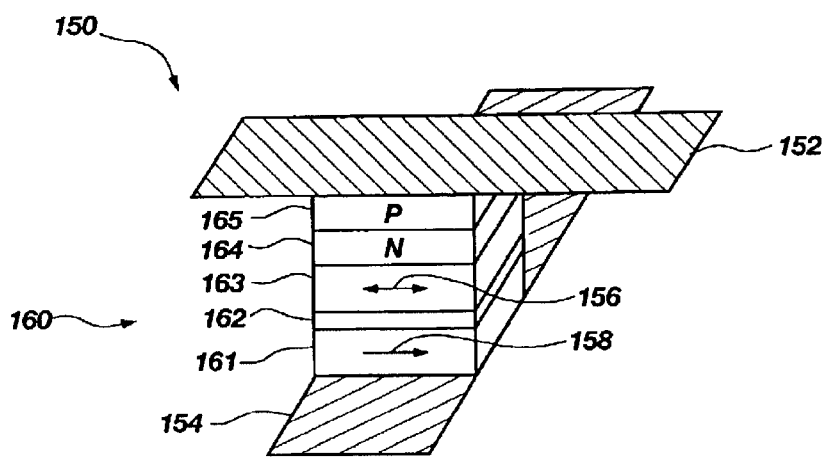
FIG. 6B is a schematic view showing the structure of a MRAM memory cell with a series PN junction diode and the conductors connected thereto.

FIG. 6B shows an MRAM memory cell 150 similar to that depicted in FIG. 2 with the addition of a PN diode. Memory unit 160 is a three-layer magnetic tunnel junction (MTJ) memory cell sandwiched between line conductors 152 and 154. A changeable magnetic sense layer 163 has two stable magnetic states corresponding to the logic states "1" and "0." The two-way arrow 156 on the sense layer 163 shows this binary-state capability. A pinned layer 161 is separated from the sense layer by a thin insulation layer 162. The resistance across the MTJ memory cell 160 is determined by the characteristics of thin insulator 162 and the orientation of the changeable magnetic sense layer 163.

A simple PN diode, is arranged in series with the memory unit 160. Layers 164 and 165 are disposed in series above sense layer 163, as shown. Alternately, the diode may be disposed beneath pinned layer 161. Further, as discussed above, a transistor or other current control element may be added in place of the PN diode, either in the same position as shown for the diode or as a separate element in series with the memory unit. Except for the addition of the diode, the structure and function of the memory unit 160 is the same as described with respect to FIG. 2.

Looking now at FIG. 7, a sense amplifier 90 is shown that applies the concepts discussed with regard to FIGS. 4A–C above in the context of sensing and adjusting voltages associated with a selected memory cell and the reference cell. Sense amplifier 90 is an adjustable current mode differential amplifier (ACMDA) having a back gate bias control mechanism for adjusting the threshold voltage of the memory cell sensing circuit. The ACMDA is basically a current mirror with an adjustable device. In this embodiment, P channel MOSFET transistors are used. However, it is possible to use N channel transistors, as shown later. NPN or PNP bipolar transistors may also be used to accomplish the purpose of the invention. The structure and operation of sense amplifier 90 is shown and described in Applicants' copending application entitled "Adjustable Current Mode Differential Amplifier" (HP docket number 100201680-1)

In FIG. 7, the gates of a "slave" transistor 92 and a "master" transistor 93 are connected together to form a mirror device. The mirror device is adjusted so that the $V_{DS}$ voltage (drain to source voltage, not shown) across the slave transistor 92 is equal to the $V_{DS}$ voltage across the master transistor 93. Since identical voltages $V_{DD}$ are applied to the sources of transistors 92 and 93 and since the voltages $V_{DS}$ across the two transistors are equal, the voltages $V_R$ and $V_S$ at the drain nodes of transistors 92 and 93, respectively, will be equal as well.

The gate of the master transistor 93 is connected to the drain of the master transistor 93 by connector 95. This connection creates a control potential $V_{GS}$ (gate to source voltage, not shown) between the master gate and the master source, based on the drain current $I_D$, which is the same as $I_{sen}$, as shown. The control potential $V_{GS}$ is applied to the gate of the slave transistor 92 which in turn develops a drain current $I_D$ in slave transistor 92, which is the same as $I_{ref}$, as shown. Since $V_S$ is equal to $V_R$, then $I_{sen}$ and $I_{ref}$ will be proportional to the physical design and size of the respective transistors. The sense and reference currents $I_{ref}$ and $I_{sen}$ flow through memory cell and reference cell circuitry 100 associated with the memory cell $R_M$ and the reference cell $R_R$.

It is important to understand that the voltage $V_{DS}$ across the master transistor 93 is equal to the voltage $V_{DS}$ across the slave transistor 92. When these voltages are equal, the relationship between the respective currents $I_{ref}$ and $I_{sen}$ is determined by only the physical parameters of the respective transistors 93 and 92. If there is an imbalance in currents, the voltage relationship will indicate the current imbalance and the direction of the current imbalance.

The drain of the master transistor 93 is connected to a node having a voltage $V_S$ which is the negative input of an operational amplifier 96. The drain of the slave transistor 92 is connected to a node having a voltage $V_R$ that is the positive input of the operational amplifier 96. The op-amp 96 output $V_O$ is connected to a transmission gate 97 that selectively connects a ramp generator 98 to the back gate 94 of master transistor 93. A capacitor 99 is connected in parallel with back gate 94 to maintain the voltage of the back gate.

The connection between the sense amplifier 90 and circuitry 100 incorporating the memory cell and the reference cell can take different forms. The form shown in FIG. 7 is adapted to sense memory cells having current control isolation as defined herein. As shown, a diode 102 is connected in series with each MTJ junction cell $R_M$ and another diode 103 is connected in series with each MTJ reference cell $R_R$. Similarly, a diode 104 is connected in series with each unselected memory cell $R_U$. The inputs to diodes 102 and 104 are connected to the node having the sense voltage $V_S$, and the inputs to diodes 103 and 104 are connected to the node having the reference voltage $V_R$. It should be noted that the nodes for $V_S$ and $V_R$ in FIG. 7 correspond to bit lines 60 and 61, respectively, in FIG. 5. Similarly, resistors $R_M$ and $R_R$ in FIG. 7 correspond to the memory elements 56 and 57, respectively, in FIG. 5.

As earlier discussed, after the back gate voltage has been adjusted in transistor 93, the sense voltage $V_S$ is approximately equal to the reference voltage $V_R$. To minimize sneak path currents, the diodes 104 of all unselected memory cells $R_U$ are reverse biased. To maintain the reverse bias on the diodes 104 of all unselected memory cells $R_U$, the Voltage $V_U$ must be greater that the first and second values of $V_R$ and the first and second values of $V_S$ during the application of the first and second bias voltages to the circuitry.

A selected memory cell $R_M$ and series diode 102 are connected between $V_S$ and an input node 106 for the bias voltages $V_{B(1)}$ and $V_{B(2)}$. Likewise, a reference cell $R_R$ and series diode 103 are connected between $V_R$ and the input node 106. The first step in setting up the sense amplifier 90 is to establish the back gate bias connection for setting $V_S$ equal to $V_R$ at a first value $V_{B(1)}$ given initial values of $I_{sen}$ and $I_{ref}$ where N times $I_{ref}$ equals $I_{sen}$. N is the physical mirror ratio, defined as: $N=(W/L_{ref})/(W/L_{sen})$. If N=1, then the slave current $I_{ref}$ will be equal to the master current $I_{sen}$ when $V_S=V_R$. However, the variation of the back gate voltage $V_{BG}$ (not shown), applied to just the master transistor 93 may require potentials greater than $V_{DD}$ to adjust the threshold of the master transistor 93 so that $I_{sen}$ is equal to $I_{ref}$. In principle, this can be done, but in practice it is difficult to generate voltages greater than the supply voltage $V_{DD}$.

Therefore, N is set to be greater than 1, so that only voltages less then $V_{DD}$ need to be applied to the back gate to achieve a $V_S=V_R$ balance for the applied $I_{sen}$ and $I_{ref}$. One embodiment uses N equal to 2 in a 3.3, volt 0.5 micron CMOS technology, where W/L is 20/1 for the slave transistor and W/L is 10/1 for the master transistor, $I_{sen}$ and $I_{ref}$ are approximately equal at about 500 nanoamps and the back gate voltage $V_{BG}$ is about 3.2 volts. Similar relationships and values would apply for N channel transistors and bipolar transistor circuits.

To establish the back gate bias connection mentioned above, one technique is to use a basic five transistor CMOS op-amp 96 having $V_S$ and $V_R$ as inputs. Op-amp 96 determines when $V_S$ is greater than or less than $V_R$ and applies an output signal $V_O$ to a transmission gate 97. This output signal opens the transmission gate 97 and connects a ramp generator 98 to the back gate of the master transistor 93, thereby adjusting the operating point of the master transistor 93 so that $V_R$ is approximately equal to $V_S$. At that point, the output signal $V_O$ changes, closing the transmission gate 97 and disconnecting the ramp generator 98 from the back gate of the master transistor 93.

The following sequence gives the steps in greater detail for adjusting the back gate voltage of the master transistor 93 to set $V_R$ approximately equal to $V_S$ with a first bias voltage $V_{B(1)}$ applied to the selected memory cell and the reference cell:

(1) Start with $V_{BG}$ "master"=$V_{DD}$.

(2) $I_{sen}$ (at $V_{BG}$=$V_{DD}$) is greater than $I_{sen}$ (at $V_{BG}$ such that $V_R$ is equal to $V_S$), so that $I_{sen}$ is greater than $I_{ref}$.

(3) $V_{BG}$=$V_{DD}$ setup leads to $V_R$ is greater than $V_S$ leads to $V_O$ approximately equals $V_{DD}$, which is a logic 1.

(4) $V_O$=logic 1 is applied to turn ON the transmission gate. Transmission gate ON leads to $V_{BG}$=$V_{ramp}$ (5) The backgate voltage is linearly reduced from $V_{DD}$ to a second lower voltage. (If $V_{DD}$ is 3.3 volts the second lower voltage may be 3.0 volts.)

(6) At some time during the application of $V_{ramp}$ the backgate voltage will reach a point where $V_S$=$V_R$. At that point, the op-amp 96 will switch its output from a logic 1 to a logic 0. The transmission gate 97 will be turned off, isolating the back gate voltage $V_{BG}$ from $V_{ramp}$ and storing the value of $V_{ramp}$ (for $V_R$=$V_S$) on the back gate node 94 of master transistor 93 for the duration of the sensing function by means of a capacitor 99.

(7) At this point the setup is complete. The back gate voltage $V_{BG}$ is stored for the duration of the sensing step. This action maintains $V_R$ and $V_S$ substantially equal during the sensing function, so that $I_{sen}$ and $I_{ref}$ will vary with the sensing of a memory cell and reference cell, respectively.

The ACMDA is now ready to sense the state of memory cells. A second bias voltage $V_{B(2)}$ is applied at a higher value than the first bias voltage $V_{B(1)}$. If $I_{sen}$ changes so that $I_{sen}$ is less than $I_{ref}$, $V_R$ will be pulled down so that $V_S$ is greater than $V_R$. At that point, the output $V_O$ of op-amp 96 will go to a logic "0". If $I_{sen}$ is greater than $I_{ref}$, $V_S$ will get pulled down so that $V_R$ is greater than $V_S$ and the output $V_O$ of the op-amp 96 will go to a logic "1".

Figure 8:
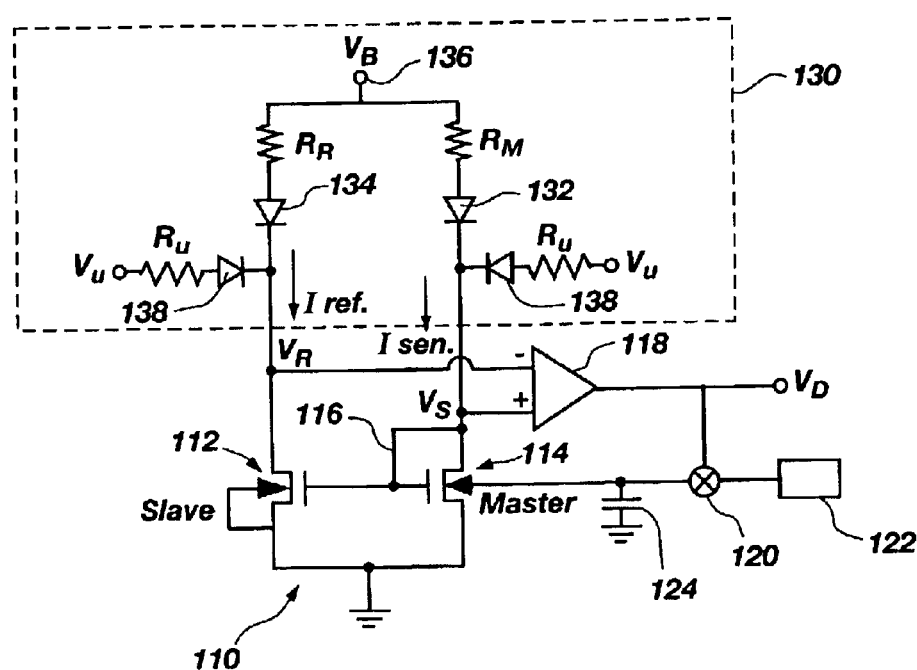
FIG. 8 is a schematic circuit diagram showing another embodiment of the sense amplifier according to the present invention.

Looking now at FIG. 8, N channel MOSFET transistors in a P-well CMOS process are applied instead of the P channel transistors used in the embodiment shown in FIG. 7. Accordingly, the circuitry layout is essentially an inverted mirror image of the circuitry shown in FIG. 7. A master transistor 114 and a slave transistor 112 have common gates connected together, which are also connected by line 116 to the drain of transistor 114. The drain of transistor 114 is also connected to a node having a voltage $V_S$ forming the positive input to an op-amp 118. The drain of transistor 112 is also connected to a node having a voltage $V_R$ forming the negative input to op-amp 118. The output of op-amp 118 controls a transmission gate 120 that selectively connects a ramp generator 122 to the back gate of master transistor 114.

The sense amplifier 110 is also connected to MRAM circuitry 130 as shown. Specifically, the drain of transistor 114 is connected to a node providing the sense voltage $V_S$ and the positive input to op-amp 118. Similarly, the drain of transistor 112 is connected to a node providing the reference voltage $V_R$ and the negative input to op-amp 116. The variable power supply $V_B$ 136 is connected through the memory cell $R_M$ and the series diode 132 to $V_S$ and also through the reference cell $R_R$ and the series diode 134 to $V_R$. A diode 138 represents diodes connected between nodes $V_R$ and $V_S$ and each of the other unselected memory cells $R_U$. The cathode of the diode 138 is connected to the cathode of diodes 132 and 134. The operation of the MRAM circuitry 130 is obvious to a person skilled in the art.

One of the advantages of the above described ACMDA circuits is that a simple differential current sensor circuit using the back gate bias techniques can be applied to sense selected memory cells using a reference cell for applications where the initial currents through the respective memory and reference cells are not equal. When the current relationship of the memory and reference cell changes, the sensor circuit will detect the changes and compare the changes to determine the state of the selected memory cell.

Another advantage is that the ACMDA circuitry can sense memory cells having control current isolation without multiple step sensing or destructive sensing of the memory cells.

Although the above embodiments are representative of the present invention, other embodiments will be apparent to those skilled in the art from a consideration of this specification and the appended claims, or from a practice of the embodiments of the disclosed invention. It is intended that the specification and embodiments therein be considered as exemplary only, with the present invention being defined by the claims and their equivalents.

What is claimed is:

1. A sensing circuit for determining the logic state of a memory cell in a resistive memory array wherein each memory cell has current control isolation, the logic state of the memory cell being determined relative to a reference cell having a pre-selected logic state, comprising:
   (a) a memory cell sensing circuit adapted to determine a first memory cell voltage associated with the memory cell when a first bias voltage is impressed on the memory cell and to determine a second memory cell voltage associated with the memory cell when a second bias voltage is impressed on the memory cell,
   (b) a reference cell sensing circuit adapted to determine a first reference cell voltage associated with the reference cell when the first bias voltage is impressed on the reference cell and to determine a second reference cell voltage associated with the reference cell when the second bias voltage is impressed on the reference cell,
   (c) an isolation circuit for applying an isolation voltage to turn off a current control element associated with each unselected memory cell, the isolation voltage being applied so as to reverse bias the current control element when the first bias voltage and the second bias voltage are applied to the memory cell and the reference cell,
   (d) an adjusting circuit for modifying at least one of (i) the first memory cell voltage and (ii) the first reference cell voltage to make the first memory cell voltage approximately equal to the first reference cell voltage at the first bias voltage, and
   (e) a state determining circuit for determining the difference between the second memory cell voltage and the second reference cell voltage in order to determine the logic state of the memory cell at the second bias voltage.

2. The sensing circuit of claim 1, wherein each current control element is a diode in series with its respective memory cell and the isolation voltage reverse biases the diodes of the unselected memory cells to stop current flow through unselected memory cells.

3. The sensing circuit of claim 1, wherein each current control element is a current control transistor and the isolation voltage turns off the current control transistors of the unselected memory cells.

4. The sensing circuit of claim 3, and further comprising a comparator circuit in communication with the memory cell node and the reference cell node for generating an output voltage in response to the difference between the second memory cell voltage and the second reference cell voltage, said difference being indicative of the logic state of the memory cell.

5. The sensing circuit of claim 1 wherein the state determining circuit comprises a device for comparing (i) the difference between the memory cell voltage and the reference cell voltage to (ii) a threshold value to determine the logic state of the memory cell.

6. The sensing circuit of claim 1 wherein the state determining circuit comprises a device for determining the positive or negative nature of the difference between the memory cell voltage and the reference cell voltage in order to determine the logic state of the memory cell.

7. The sensing circuit of claim 1 wherein the memory cell sensing circuit comprises a sensing transistor and the reference cell sensing circuit comprises a reference transistor having its gate in common with the gate of the sensing transistor.

8. The sensing circuit of claim 7 wherein the adjusting circuit comprises a voltage adjusting device connected to the back gate of the sensing transistor to selectively modify the voltage on the back gate of the sensing transistor to a balance point where the first reference cell voltage is approximately equal to the first memory cell voltage.

9. The sensing circuit of claim 8 and further comprising an electrical storage device associated with the back gate of the sensing transistor to maintain the voltage on the back gate at the balance point.

10. The sensing circuit of claim 8 wherein the voltage adjusting device comprises a variable voltage generator and a device for selectively connecting the variable voltage generator to the back gate of the sensing transistor.

11. The sensing circuit of claim 10 further comprising a comparator in communication with the variable voltage generator and in communication with the memory cell node and the reference cell node for determining the difference between the first memory cell voltage and the first reference cell voltage and for selectively connecting the variable voltage generator to the back gate of the sensing transistor in response to said difference.

12. A sensing circuit for determining the logic state of a memory cell in a resistive memory device, using a reference cell previously set to a known logic state, comprising:
   (a) a first bias voltage source for applying a first bias voltage to the memory cell and the reference cell;
   (b) a first sensing device for sensing a first memory cell voltage associated with the memory cell and a first reference cell voltage associated with the reference cell, both at the first bias voltage;
   (c) an isolation circuit for applying an isolation voltage to turn off a current control element associated with each unselected memory cell, the isolation voltage being applied so as to reverse bias the current control element when the first bias voltage and the second bias voltage are applied to the memory cell and the reference cell;

(d) an adjusting device for modifying the first memory cell voltage and/or first reference cell parameter so that the first reference cell voltage is approximately equal to the first memory cell voltage;

(e) a second bias voltage source for applying a second bias voltage to the memory cell and the reference cell;

(f) a second sensing device for sensing a second memory cell voltage associated with the memory cell and a second reference cell voltage associated with the reference cell, both at the second bias voltage; and (g) a comparing circuit for comparing the difference between the second memory cell voltage and the second reference cell voltage to determine the logic state of the memory cell.

13. The sensing circuit of claim 12, wherein each current control element is a diode and the isolation voltage reverse biases the diodes of the unselected memory cells.

14. The sensing circuit of claim 13, wherein each diode is in series with its respective memory cell so that the reverse biased diode stops current flow through unselected memory cells.

15. A method of determining the logic state of memory cells in a resistive memory array relative to a reference cell having a pre-selected logic state, wherein the memory cells have current control isolation, comprising:

(a) sensing a first memory cell voltage associated with the memory cell when a first bias voltage is impressed on the memory cell and sensing a second memory cell voltage associated with the memory cell when a second bias voltage is impressed on the memory cell;

(b) sensing a first reference cell voltage associated with the reference cell when the first bias voltage is impressed on the reference cell and sensing a second reference cell voltage associated with the reference cell when the second bias voltage is impressed on the reference cell;

(c) applying an isolation voltage to turn off a current control element associated with each unselected memory cell, the isolation voltage being applied so as to reverse bias the current control element when the first bias voltage and the second bias voltage are applied to the memory cell and the reference cell;

(d) modifying the first memory cell voltage and/or the first reference cell voltage to make the memory cell voltage approximately equal to the reference cell voltage; and (e) determining the difference between the second memory cell voltage and the second reference cell voltage in order to determine the logic state of the memory cell.

16. The method of claim 15 wherein the determining step involves comparing the difference between the first memory cell voltage and the first reference cell voltage to a threshold value to determine the logic state of the memory cell.

17. The method of claim 15 wherein the determining step involves determining the positive or negative nature of the difference between the first memory cell voltage and the first reference cell voltage to determine the logic state of the memory cell.

18. The method of claim 15 wherein each current control element is a diode and further including the step of applying the isolation voltage to reverse bias the diodes of the unselected memory cells so that the reverse biased diode stops current flow through unselected memory cells.

19. The method of claim 15, wherein a sensing transistor is used to sense the memory cell and a reference transistor having its gate in common with the gate of the sensing transistor is used to sense the reference cell.

20. The method of claim 19, wherein the modifying step comprises adjusting the voltage applied to the back gate of the sensing transistor or the reference transistor to selectively modify the voltage on the back gate of the sensing transistor or the reference transistor to a balance point where the first reference cell voltage is approximately equal to the first memory cell voltage.

21. The method of claim 20, wherein the voltage on the back gate is maintained at the balance point by an electrical storage device.

22. The method of claim 20, wherein the voltage is adjusted on the back gate by selectively applying a variable voltage generator to the back gate.

23. A method for determining the logic state of a selected memory cell in a resistive memory array, using a reference cell previously set to a known logic state, wherein the memory cells have current control isolation, comprising:

(a) applying a first bias voltage to the selected memory cell and the reference cell;

(b) measuring a first memory cell voltage associated with the selected memory cell and a first reference cell voltage associated with the reference cell, both at the first bias voltage;

(c) adjusting the first memory cell parameter and/or first reference cell parameter so that the first reference cell parameter is approximately equal to the first memory cell voltage;

(d) applying a second bias voltage to the memory cell and the reference cell;

(e) measuring a second memory cell voltage associated with the memory cell and a second reference cell voltage associated with the reference cell, both at the second bias voltage;

(f) applying an isolation voltage to turn off a current control element associated with each unselected memory cell, the isolation voltage being applied so as to reverse bias the current control element when the first bias voltage and the second bias voltage are applied to the memory cell and the reference cell;

(g) comparing the difference between the second memory cell voltage and the second reference cell voltage to determine the logic state of the memory cell.

* * * * *